United States Patent
Wang et al.

(10) Patent No.: US 8,975,137 B2
(45) Date of Patent: Mar. 10, 2015

(54) PROCESS OF FORMING SLIT IN SUBSTRATE

(75) Inventors: Wen-Chieh Wang, Taoyuan County (TW); Yi-Nan Chen, Taipei (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/179,581

(22) Filed: Jul. 11, 2011

(65) Prior Publication Data

US 2013/0017684 A1 Jan. 17, 2013

(51) Int. Cl.
| H01L 21/336 | (2006.01) |
| H01L 21/3205 | (2006.01) |
| H01L 21/461 | (2006.01) |
| H01L 21/3065 | (2006.01) |
| H01L 21/308 | (2006.01) |

(52) U.S. Cl.
CPC ........ *H01L 21/3065* (2013.01); *H01L 21/3085* (2013.01)
USPC ............ 438/270; 438/296; 438/589; 438/719

(58) Field of Classification Search
USPC ........... 438/270, 296, 589, 719; 257/E21.429
See application file for complete search history.

(56) References Cited

U.S. PATENT DOCUMENTS

| 5,674,775 A | * | 10/1997 | Ho et al. | 438/296 |
| 5,753,561 A | * | 5/1998 | Lee et al. | 438/424 |
| 5,830,807 A | * | 11/1998 | Matsunaga et al. | 438/714 |
| 6,291,356 B1 | * | 9/2001 | Ionov et al. | 438/710 |
| 6,514,817 B1 | * | 2/2003 | Tsai et al. | 438/248 |
| 6,541,164 B1 | * | 4/2003 | Kumar et al. | 430/5 |
| 7,456,466 B2 | * | 11/2008 | Om et al. | 257/315 |
| 7,838,361 B2 | * | 11/2010 | Cho et al. | 438/259 |
| 2002/0151149 A1 | * | 10/2002 | Liu et al. | 438/391 |
| 2005/0180210 A1 | * | 8/2005 | Harari et al. | 365/185.03 |
| 2005/0186746 A1 | * | 8/2005 | Lee et al. | 438/300 |
| 2006/0234451 A1 | * | 10/2006 | Slesazeck et al. | 438/259 |
| 2008/0090356 A1 | * | 4/2008 | Park et al. | 438/270 |
| 2010/0148248 A1 | * | 6/2010 | Mikasa | 257/334 |
| 2011/0008941 A1 | * | 1/2011 | Lee et al. | 438/270 |
| 2011/0014773 A1 | * | 1/2011 | Lin et al. | 438/424 |
| 2011/0171797 A1 | * | 7/2011 | Om et al. | 438/257 |

FOREIGN PATENT DOCUMENTS

| CN | 1855429 | 11/2006 |
| JP | 61232620 A | * 10/1986 |

OTHER PUBLICATIONS

"Office Action of China Counterpart Application", issued on Jul. 8, 2014, p. 1-7.

* cited by examiner

*Primary Examiner* — Charles Garber
*Assistant Examiner* — Ron Pompey
(74) *Attorney, Agent, or Firm* — Jianq Chyun IP Office

(57) ABSTRACT

A process of forming a slit in a substrate is provided. A mask layer is formed on a substrate, wherein the mask layer does not include carbon. An etching process is performed to be substrate by using the mask layer as a mask, so as to form a slit in the substrate. The etching gas includes $Cl_2$, $CF_4$ and $CHF_3$, a molar ratio of $CF_4$ to $CHF_3$ is about 0.5-0.8, and a molar ratio of F to Cl is about 0.4-0.8, for example. Further, the step of performing the etching process simultaneously removes the mask layer.

7 Claims, 1 Drawing Sheet

PROCESS OF FORMING SLIT IN SUBSTRATE

BACKGROUND OF THE INVENTION

1. Field of Invention

The present invention relates to an etching process, and more generally to a process of forming a slit in a silicon substrate.

2. Description of Related Art

In order to accelerate operating speed of integrated circuits and to meet customers' demands for miniaturizing electronic devices, physical dimensions of transistors in a semiconductor apparatus are continuously reduced. However, with the reduction in physical dimensions of transistors, the length of channel regions in the transistors is also decreased. Thus, a severe short channel effect would occur in the transistors.

To resolve said issue, a conventional horizontal transistor structure is recently replaced by a vertical transistor structure in the industry. For example, a gate is filled in a slit of a substrate. Hence, the operating speed and integration of integrated circuits are enhanced and problems such as short channel effect are avoided. The slit is usually formed between shallow trench isolation (STI) structures. However, during the step of forming the slit in the substrate, silicon oxide in STI structures is exposed and damaged by the etching process. As a result, the performance and reliability of the device are affected.

SUMMARY OF THE INVENTION

Accordingly, the present invention provides a process of forming a slit in a substrate, in which silicon oxide in STI structures is not damaged during the slit etching process, so that the performance and reliability of the device are enhanced.

The present invention provides a process of forming at least one slit in a substrate. A mask layer is formed on a substrate, wherein the mask layer does not include carbon. An etching process is performed to the substrate by using the mask layer as a mask, so as to form a slit in the substrate. The etching gas includes $Cl_2$, $CF_4$ and $CHF_3$, a molar ratio of $CF_4$ to $CHF_3$ is about 0.5-0.8, and a molar ratio of F to Cl is about 0.4-0.8. Further, the step of performing the etching process simultaneously removes the mask layer.

According to an embodiment of the present invention, the substrate has a plurality of STI structures formed therein, the mask layer is formed on the substrate to expose at least a portion of the substrate between the STI structures, and an etching selectivity of the mask layer to the substrate is from about 0.05 to 0.06 and an etching selectivity of silicon oxide in the STI structures to the mask layer is less than 0.05.

According to an embodiment of the present invention, the substrate includes silicon.

According to an embodiment of the present invention the mask layer includes TEOS or silicon nitride.

According to an embodiment of the present invention, the molar ratio of $CF_4$ to $CHF_3$ is about 0.6-0.7, and the molar ratio of F to Cl is about 0.5-0.7.

According to an embodiment of the present invention, a ratio of a depth to a width of the slit is about 2-5.

According to an embodiment of the present invention, the depth of the slit is about 200-220 nm, and the width of the same is about 40-110 nm.

In view of the above, the process of forming the slits in the substrate can simultaneously remove the mask layer for defining the slits, so that the additional step of removing the mask layer is not necessary. Further, during the slit etching process, the slits are formed adjacent to a portion of the STI structure, and damage to silicon oxide in STI structures is prevented, and thus, the performance and reliability of the device are enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
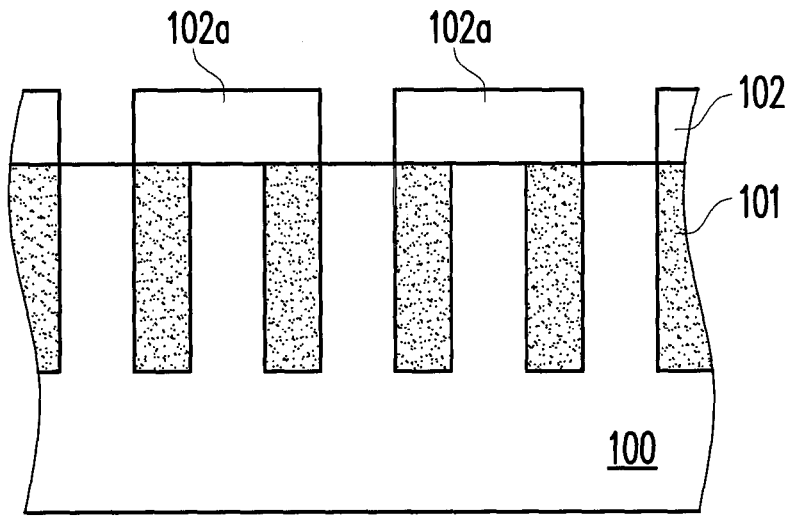
FIGS. 1A-1B schematically illustrate cross-sectional views of a process of forming a silt in a substrate according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
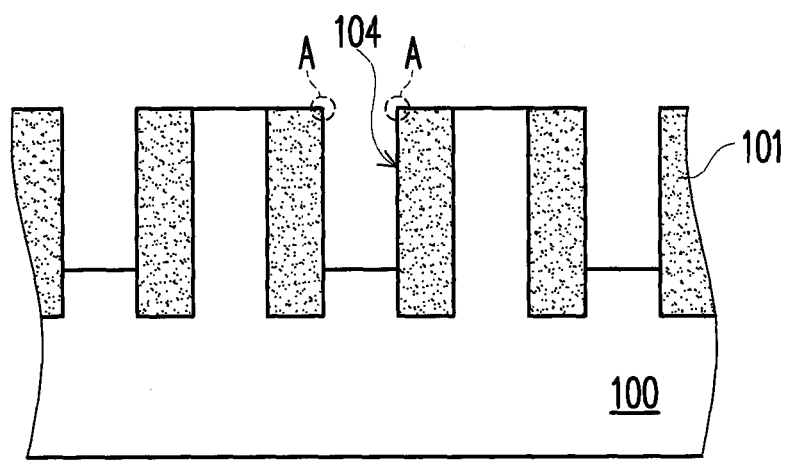

FIGS. 1A-1B schematically illustrate cross-sectional views of a process of forming a silt in a substrate according to an embodiment of the present invention.

Referring to FIG. 1A, a mask layer 102 is formed on a substrate 100. The substrate 100 is a silicon substrate, for example. The substrate 100 has a plurality of STI structures 101 formed therein. Specifically, the mask layer 102 having a plurality of patterns 102a is formed on the substrate 100 to expose at least a portion of the substrate 100 between the STI structures 101. In an embodiment, each pattern 102a covers two STI structures 101, and the edge of the patterns 102a are aligned with those of the STI structures 101, as shown in FIG. 1A. However, the present invention is not limited thereto. In another embodiment (not shown), each pattern 102a can cover only one or more than two STI structures 101, and the edge of the patterns 102a are not aligned with those of the STI structures 101 so as to expose a portion of the STI structures 101.

Further, the method of forming the mask layer 102 includes sequentially forming a patterned photoresist layer (not shown) and a mask material layer (not shown) on the substrate 100, and then patterning the mask material layer by using the patterned photoresist layer as a mask. It is noted that the mask layer 102 does not include carbon. Specifically, the mask layer 102 does not include silicon carbide, silicon oxycarbide, or amorphous carbon. In an embodiment, the mask layer 102 includes TEOS or silicon nitride.

Referring to FIG. 1B, an etching process is performed to the substrate 100 by using the mask layer 102 as a mask, so as to form at least one slit 104 in the substrate 100. In this embodiment, three slits 104 are provided only for illustration purposes. The number of the slits 104 is not limited by the present invention.

The etching gas includes $Cl_2$, $CF_4$ and $CHF_3$. The molar ratio of $CF_4$ to $CHF_3$ is about 0.5-0.8, such as about 0.6-0.7. The molar ratio of F to Cl is about 0.4-0.8, such as 0.5-0.7. Within the specific $CF_4/CHF_3$ and Cl/F ratio ranges, the slits 104 are formed with substantially vertical sidewalls. The angle between a bottom and a sidewall of the slit 104 is close to a right angle, for example, about 92-96 degrees.

Further, the depth-to-width ratio of each slit 104 is about 2-5, for example. The depth of the slits 104 is about 200-220 nm, and the width of the same is about 40-110 nm, for example. In an embodiment, the depth of the slits 104 is about 214 nm, and the width of the same is about 62 nm.

It is noted that the step of forming the slits 104 simultaneously removes the mask layer 102. That is to say, the etching selectivity of the mask layer 102 (e.g. a TEOS layer or a silicon nitride layer) or the substrate 100 (e.g. a silicon substrate) to silicon oxide in the STI structures 101 is high enough, so that a portion of the substrate 100 in which the slits 104 are to be formed and the mask layer 102 can be removed at the same, while damage to silicon oxide in the STI structures 101 is prevented. As shown in FIG. 1B, the oxide corners A of the STI structures 101 are not damaged during the step of forming the slits 104. In an embodiment, the etching selectivity of the mask layer 102 to the Si substrate 100 is from about 0.05 to 0.06 and the etching selectivity of silicon oxide in the STI structures 101 to the mask layer 102 is less than 0.05. Further, due to the high etching selectivity, sidewall roughness of the slits 104 is not observed.

After the slits 104 are formed in the substrate 100 adjacent to a portion of the STI structures 101, other known components such as a gate oxide layer, a gate, source and drain regions and etc. are formed by the known techniques to complete the process. The materials, configurations and firming methods of these components are known to persons skilled in the art, so that the details are not iterated herein.

In above-mentioned embodiment, the etching gas composition including $Cl_2$, $CF_4$ and $CHF_3$ and the specific $CF_4$/$CHF_3$ and Cl/F ratio ranges are used for forming at least one slit in a substrate. However, the present invention is not limited thereto. It is appreciated by persons skilled in the art that the etching gas composition and the specific gas ratio ranges can be used for other semiconductor processes which require a high etching selectivity of TEOS (or silicon nitride or silicon) to silicon oxide.

In summary, the process of forming the slits in the substrate can simultaneously remove the mask layer for defining the slits. That is, in the slit etching process of the present invention, the additional step of removing the mask layer can be omitted. Therefore, as compared with the conventional process, the process of the present invention is better with less process steps and cost. Further, silicon oxide in STI structures is not damaged by the new etching recipe of the present invention, so that the performance and reliability of the device are enhanced.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A process of forming a slit in a substrate, comprising:
    forming a mask layer on a plurality of STI structures in a substrate to cover upper surfaces of the STI structures and expose upper surfaces of the substrate between the STI structures and not covered by the mask layer, wherein the mask layer does not comprise carbon; and
    performing an etching process to the substrate by using the mask layer as a mask, so as to form at least one slit in the substrate between the STI structures and expose a portion of the STI structures, wherein an etching gas is composed of $Cl_2$, $CF_4$ and $CHF_3$, a molar ratio of $CF_4$ to $CHF_3$ is about 0.5-0.8, and a molar ratio of F to Cl is about 0.4-0.8,
    wherein damage to silicon oxide in the STI structures exposed in the etching process is prevented because an etching selectivity of silicon oxide in the STI structures to the mask layer is less than 0.05,
    wherein the step of performing the etching process simultaneously removes the mask layer completely to expose upper surface of the substrate.

2. The process of claim 1, wherein an etching selectivity of the mask layer to the substrate is from about 0.05 to 0.06.

3. The process of claim 1, wherein the substrate comprises silicon.

4. The process of claim 1, wherein the mask layer comprises TEOS or silicon nitride.

5. The process of claim 1, wherein the molar ratio of $CF_4$ to $CHF_3$ is about 0.6-0.7, and the molar ratio of F to Cl is about 0.5-0.7.

6. The process of claim 1, wherein a ratio of a depth to a width of the slit is about 2-5.

7. The process of claim 6, wherein the depth of the slit is about 200-220 nm, and the width of the slit is about 40-110 nm.

* * * * *